United States Patent
Chen et al.

(10) Patent No.: US 10,347,776 B2
(45) Date of Patent: Jul. 9, 2019

(54) BACK-SURFACE BRIDGE TYPE CONTACT ELECTRODE OF CRYSTALLINE SILICON SOLAR BATTERY AND PREPARATION METHOD THEREFOR

(71) Applicant: Changzhou Trina Solar Energy Co., Ltd., Changzhou (CN)

(72) Inventors: Yifeng Chen, Changzhou (CN); Pierre J. Verlinden, Changzhou (CN); Zhiqiang Feng, Changzhou (CN); Hui Shen, Guangzhou (CN); Pietro P. Altermatt, Hannover (DE)

(73) Assignee: Trina Solar Co., Ltd. (CN)

( * ) Notice: Subject to any disclaimer, the term of this patent is extended or adjusted under 35 U.S.C. 154(b) by 0 days.

(21) Appl. No.: 15/024,762

(22) PCT Filed: Jul. 31, 2014

(86) PCT No.: PCT/CN2014/083399
§ 371 (c)(1),
(2) Date: Mar. 24, 2016

(87) PCT Pub. No.: WO2015/043311
PCT Pub. Date: Apr. 2, 2015

(65) Prior Publication Data
US 2016/0233356 A1    Aug. 11, 2016

(30) Foreign Application Priority Data
Sep. 25, 2013   (CN) .......................... 2013 1 0440907

(51) Int. Cl.
*H01L 31/00*    (2006.01)
*H01L 31/18*    (2006.01)
(Continued)

(52) U.S. Cl.
CPC .... *H01L 31/022441* (2013.01); *H01L 31/028* (2013.01); *H01L 31/02167* (2013.01);
(Continued)

(58) Field of Classification Search
CPC ......... H01L 31/022441; H01L 31/1868; H01L 31/1864; H01L 31/028; H01L 31/022425; H01L 31/02167; Y02E 10/50
(Continued)

(56) References Cited

U.S. PATENT DOCUMENTS

2008/0061293 A1* 3/2008 Ribeyron ........ H01L 31/022433
257/53
2010/0032014 A1* 2/2010 Bettinelli ........ H01L 31/022441
136/258
(Continued)

FOREIGN PATENT DOCUMENTS

CN    102437246 A    5/2012
CN    103474486 A    12/2013
(Continued)

OTHER PUBLICATIONS

English machine translation of TW 201248873 A1 (Year: 2017).*

*Primary Examiner* — Angelo Trivisonno
(74) *Attorney, Agent, or Firm* — St. Onge Steward Johnston and Reens LLC

(57) ABSTRACT

Disclosed are a back-surface bridge type contact electrode of a crystalline silicon solar battery and a preparation method therefor. The back-surface bridge type contact electrode of a crystalline silicon solar battery includes a local electrode connected to a local back surface field and a back surface electrode which is covered with a back surface passivation film on a contact surface with a silicon wafer substrate, at least one bridge electrode is provided between the local electrode and the back surface electrode, the contact surface
(Continued)

of the bridge electrode and the silicon wafer substrate is also covered with the back surface passivation film, the local electrode is connected to the back surface electrode via the bridge electrode, and the back surface passivation film is also provided, besides at the connection region of the bridge electrode, between the local electrode and the back surface electrode.

11 Claims, 3 Drawing Sheets

(51) Int. Cl.
    *H01L 31/0224* (2006.01)
    *H01L 31/0216* (2014.01)
    *H01L 31/028* (2006.01)

(52) U.S. Cl.
    CPC .. *H01L 31/022425* (2013.01); *H01L 31/1864* (2013.01); *H01L 31/1868* (2013.01); *Y02E 10/50* (2013.01)

(58) Field of Classification Search
    USPC .......................................................... 136/256
    See application file for complete search history.

(56) References Cited

U.S. PATENT DOCUMENTS

| | | | | |
|---|---|---|---|---|
| 2010/0126573 A1* | 5/2010 | Youtsey | .......... | H01L 31/022441 |
| | | | | 136/255 |
| 2011/0011440 A1* | 1/2011 | Hioki | .............. | H01L 31/022433 |
| | | | | 136/244 |
| 2012/0012176 A1* | 1/2012 | Kim | ................ | H01L 31/022425 |
| | | | | 136/256 |

FOREIGN PATENT DOCUMENTS

| | | | | |
|---|---|---|---|---|
| KR | 20130065446 A | 6/2013 | | |
| TW | 201248873 A | 12/2012 | | |
| TW | 201248873 A1 * | 12/2012 | ............. | Y02E 10/50 |

\* cited by examiner ion is to overcome the deficiencies in the prior art, and
BACK-SURFACE BRIDGE TYPE CONTACT ELECTRODE OF CRYSTALLINE SILICON SOLAR BATTERY AND PREPARATION METHOD THEREFOR

TECHNICAL FIELD

The present invention relates to a back-surface bridge type contact electrode of a crystalline silicon solar battery and a preparation method therefor, and falls within the technical field of solar batteries.

BACKGROUND ART

At present, local back surface field batteries are an important research and development direction of efficient crystalline silicon solar batteries, and by means of a back surface passivation technique and a local back surface field structure, the recombination in the back surface of a solar battery can be remarkably reduced, the back reflection within long-wave bands is improved, and the absorption of free carriers in the back surface is reduced, such that the conversion efficiency of the battery is improved. At present, in order to reduce the process for preparing a back passivation battery, a back surface passivation film is locally opened using a laser or chemical slurry erosion method, then an aluminium layer is formed on the back surface using a silk screen printing or evaporation method, and then aluminium atoms instead of silicon atoms enter the silicon crystal lattice in a high temperature process to form a p-type heavily-doped region, i.e. a local back surface field, below the open film region.

However, when using a conventional method of full back surface printing or aluminium layer depositing, it is easy to form voids in the contact region in the high temperature process due to the difference of diffusion coefficients between aluminium and silicon, which causes: 1. a local back surface field cannot be formed, and severe recombinations in the back surface are caused; 2. the contact area between the local back surface field and the aluminium-silicon alloy layer becomes small, and the fill factor is reduced; and 3. due to the void effect, the thickness of the local back surface field is insufficient, and the formation of the voids restricts current local back surface field batteries, particularly the efficiency improvement of back point contact batteries.

SUMMARY

The technical problem to be solved by the present invention is to overcome the deficiencies in the prior art, and provide a back-surface bridge type contact electrode of a crystalline silicon solar battery, which can inhibit the formation of voids in the local back surface field, increase the thickness of the local back surface field, reduce the resistance loss due to the fact that a minority of carriers pass through the local back surface field to the contact region to be recombined, and improve the conversion efficiency of the back passivation battery.

The technical solution used in the present invention to solve the above-mentioned technical problems is: a back-surface bridge type contact electrode of a crystalline silicon solar battery, which comprises a local electrode connected to a local back surface field and a back surface electrode which is covered with a back surface passivation film on a contact surface with a silicon wafer substrate, at least one bridge electrode is provided between the local electrode and the back surface electrode, the contact surface of the bridge electrode and the silicon wafer substrate is also covered with the back surface passivation film, the local electrode is connected to the back surface electrode via the bridge electrode, and the back surface passivation film is also provided, besides at the connection region of the bridge electrode, between the local electrode and the back surface electrode.

Further, the width of the bridge electrode is 0.1-50,000 μm, and the length is 0.1-1,000 μm. By controlling the width and length of the bridge electrode, the total amount of silicon which diffuses into the aluminium-silicon liquid alloy in the high temperature process can be controlled.

Further, the material of the back surface passivation film is selected from one or more of aluminium oxide, silicon oxide, silicon nitride and titanium oxide.

Further, the materials of the local electrode, the back surface electrode and the bridge electrode contain aluminium.

Further, the cross section of the local electrode is in a line or dot shape, and the dot shape includes a circle, parallelogram or regular polygon.

Further, when the cross section of said local electrode is in a line shape, the width of the local electrode is not less than 1 μm, and the spacing between the centres of the local electrodes is not less than 100 μm.

Further, when the cross section of said local electrode is in a dot shape, the size of the local electrode is not less than 1 μm, and the spacing between the centres of the local electrodes is not less than 50 μm.

The present invention further provides a method for preparing the back-surface bridge type contact electrode of a crystalline silicon solar battery, which comprises the following steps:

1) providing a screen plate for silk screen printing, wherein the screen plate provides a gauze in the back surface electrode region and an array region composed of a plurality of local electrodes and bridge electrodes in the back-surface bridge type contact electrode of a crystalline silicon solar battery, through which a slurry can pass, and the other part is composed of a membrane which is impermeable to the slurry;

2) providing a silicon wafer substrate on which a back surface passivation film is deposited, and locally opening the film with a laser;

3) printing a metal slurry on the back surface of the silicon wafer substrate using the screen plate in step 1) by a silk screen printing method; and 4) the local electrodes and the silicon wafer substrate forming a local back surface field in a process of high temperature sintering.

The present invention further provides a method for preparing the back-surface bridge type contact electrode of a crystalline silicon solar battery, which comprises the following steps:

1) providing a silicon wafer substrate on which a back surface passivation film is deposited, and locally opening the film with a laser;

2) depositing a unit formed by the arrangement of a back surface electrode and a plurality of local electrodes and bridge electrodes in the back-surface bridge type contact electrode of a crystalline silicon solar battery on the back surface passivation film of the silicon wafer substrate by a CVD or PVD method; and 3) the local electrodes and the silicon wafer substrate forming a local back surface field in a process of high temperature sintering.

By using the above-mentioned technical solutions, the present invention has the following beneficial effects:

(1) the local electrode is used in the present invention to greatly reduce the probability of voids appearing in the local back surface field, and improve the open circuit voltage and the fill factor of the battery; and the formation of the local electrode in the open film region in the present invention restricts the transversal transmission of silicon in the electrode in the high temperature process, and if each electrode contains aluminium, it can enable the concentration of silicon in the aluminium-silicon liquid alloy to rapidly reach the saturation value, and silicon is rapidly precipitated from the aluminium silicon liquid in a temperature decreasing process and solidified at the aluminium-silicon interface to form a local back surface field, which greatly inhibits the generation of voids;

(2) the bridge electrode is used to conduct the electric current collected in the local electrode to the back surface electrode, and using the bridge electrode and the back surface electrode reduces the resistance of the back surface electrode, thereby reducing the resistance loss of the battery; and (3) the process of the present invention is simple, can achieve the structure of the present invention by only printing once with regard to conventional silk screen printing, and is suitable for use in large-scale production.

DETAILED EMBODIMENTS

In order to more easily and clearly understand the contents of the present invention, the present invention is further illustrated below in detail according to particular embodiments in combination with the drawings.

Embodiment I

Figure 3:
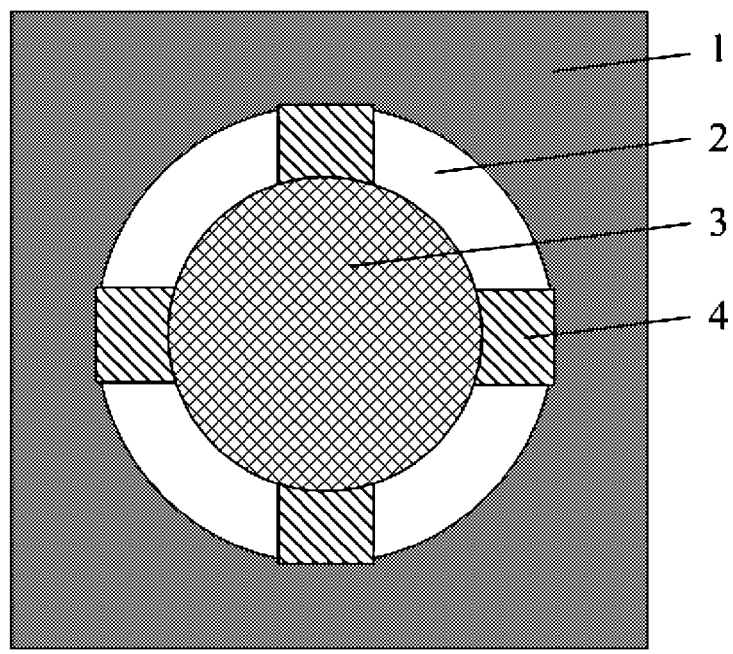
FIG. 3 is a structure schematic view of a third structure of the back-surface bridge type contact electrode of a crystalline silicon solar battery of the present invention.

As shown in FIG. 3, a back-surface bridge type contact electrode of a crystalline silicon solar battery is provided, which comprises a local electrode 3 connected to a local back surface field 5 and a back surface electrode 1 which is covered with a back surface passivation film 2 on a contact surface with a silicon wafer substrate 6, four bridge electrodes 4 are provided between the local electrode 3 and the back surface electrode 1, the contact surface of the bridge electrodes 4 and the silicon wafer substrate 6 is also covered with the back surface passivation film 2, the local electrode 3 is connected to the back surface electrode 1 via the bridge electrodes 4, and the back surface passivation film 2 is also provided, besides at the connection region of the bridge electrodes 4, between the local electrode 3 and the back surface electrode 1.

The material of the back surface passivation film 2 may be selected from one or more of aluminium oxide, silicon oxide, silicon nitride and titanium oxide. The materials of the local electrode 3, the back surface electrode 1 and the bridge electrodes 4 contain aluminium.

This embodiment provides a circular hole-shaped array of back-surface bridge type contact electrodes of a crystalline silicon solar battery, which is prepared through silk screen printing, and after the deposition of an $Al_2O_3/SiN_x$: H passivation film on the back surface is complete, the film is opened using a chemical slurry. Through a screen plate design, the use of silk screen printing and a well designed back surface screen plate, an aluminium slurry is printed on the back surface to make it form a pattern formed by an array of a plurality of circular holes, wherein the spacing between the circular hole contacts is 500 μm, the pattern of a single circular hole point contact is as shown in FIG. 3, the diameter of the circular hole is 100 μm, the distance between the edge of the circular hole and the back surface electrode 1 which is covered on the $Al_2O_3/SiN_x$: H passivation film 2 is 20 μm, and through the screen plate design, the circular hole is connected to the back surface electrode 1 via four channels in the process of printing, the width of the channels are 50 μm, and the length thereof is equal to the distance between the edge of the circular hole and the back surface electrode 1, i.e. also 20 μm. After conventional sintering, the circular hole and the silicon wafer substrate 6 therebelow form a local back surface field 5, the circular hole also forms a local electrode 3, the bridge electrodes 4 are formed inside the channels, and the local electrode 3 is interconnected with the back surface electrode 1 via the four bridge electrodes 4. Since besides the place in contact with the bridge electrodes 4, the local electrode 3 and the back surface electrode 1 are isolated by the $Al_2O_3/SiN_x$: H passivation film, the diffusion of silicon in the aluminium-silicon alloy liquid is restricted in the high temperature process, which thus greatly reduces the generation of voids. If using a method of fully printing an aluminium slurry on the back surface and sintering instead of the method provided by the present invention, the void rate is 100%; however, if using the method provided by the present invention, the void rate is reduced to 20% from 100%, and is effectively reduced.

Embodiment II

Figure 4:
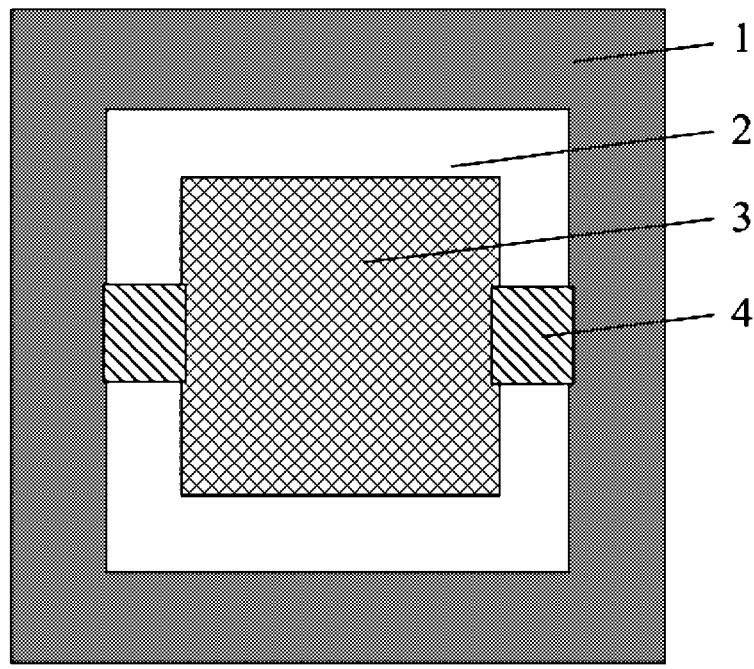
FIG. 4 is a structure schematic view of a fourth structure of the back-surface bridge type contact electrode of a crystalline silicon solar battery of the present invention.
Figure 5:
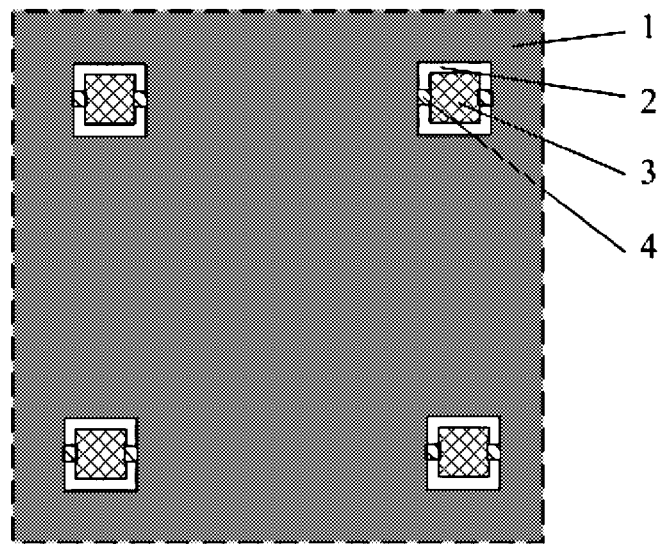
FIG. 5 is a structure schematic view of an array form of the third structure of the back-surface bridge type contact electrode of a crystalline silicon solar battery of the present invention.

As shown in FIGS. 4 and 5, a back-surface bridge type contact electrode of a crystalline silicon solar battery is provided, which comprises a local electrode 3 connected to a local back surface field 5 and a back surface electrode 1 which is covered with a back surface passivation film 2 on a contact surface with a silicon wafer substrate 6, two bridge electrodes 4 are provided between the local electrode 3 and the back surface electrode 1, the contact surface of the bridge electrodes 4 and the silicon wafer substrate 6 is also covered with the back surface passivation film 2, the local electrode 3 is connected to the back surface electrode 1 via the bridge electrodes 4, and the back surface passivation film 2 is also provided, besides at the connection region of the bridge electrodes 4, between the local electrode 3 and the back surface electrode 1.

The material of the back surface passivation film 2 may be selected from one or more of aluminium oxide, silicon oxide, silicon nitride and titanium oxide.

The materials of the local electrode 3, the back surface electrode 1 and the bridge electrodes 4 contain aluminium.

This embodiment provides a square hole-shaped array of back-surface bridge type contact electrodes of a crystalline silicon solar battery, which is prepared through silk screen printing, and after the deposition of an $Al_2O_3/SiN_x$: H passivation film 2 on the back surface and the local opening of the film with a laser are complete, through a screen plate design, an aluminium slurry is printed on the back surface using silk screen printing to make it form a pattern formed by the array of square holes. The spacing between the centres of the square holes is 400 µm, the pattern of a single square hole point contact is as shown in FIG. 4, the side length of the square hole is 80 µm, the distance between the edge of the square hole and the back surface electrode 1 is 30 µm, and two bridge electrodes 4 connecting the square hole and the back surface electrode 1 are further formed in the same printing, the width of the bridge electrodes 4 being 40 µm, the length thereof being 30 µm. After conventional sintering, the local electrode 3 inside the square hole and the silicon wafer substrate 6 therebelow form a local back surface field 5. Besides the place in contact with the bridge electrodes 4, the local electrode 3 and the back surface electrode 1 are isolated by the $Al_2O_3/SiN_x$: H passivation film 2, by using the method provided by the present invention, the void rate is reduced to 22% from 90%, and a part of the square hole point contact array on the back surface is as shown in FIG. 5.

Embodiment III

Figure 6:
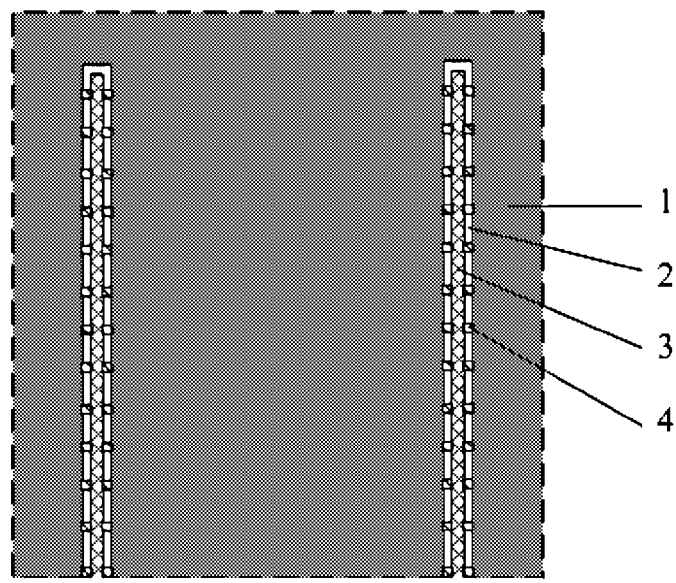
FIG. 6 is a structure schematic view of an array form of the fourth structure of the back-surface bridge type contact electrode of a crystalline silicon solar battery of the present invention.

As shown in FIG. 6, a back-surface bridge type contact electrode of a crystalline silicon solar battery is provided, which comprises a local electrode 3 connected to a local back surface field 5 and a back surface electrode 1 which is covered with a back surface passivation film 2 on a contact surface with a silicon wafer substrate 6, a plurality of bridge electrodes 4 are provided between the local electrode 3 and the back surface electrode 1, the contact surface of the bridge electrodes 4 and the silicon wafer substrate 6 is also covered with the back surface passivation film 2, the local electrode 3 is connected to the back surface electrode 1 via the bridge electrodes 4, and the back surface passivation film 2 is also provided, besides at the connection region of the bridge electrodes 4, between the local electrode 3 and the back surface electrode 1.

The material of the back surface passivation film 2 may be selected from one or more of aluminium oxide, silicon oxide, silicon nitride and titanium oxide. The materials of the local electrode 3, the back surface electrode 1 and the bridge electrodes 4 contain aluminium.

This embodiment provides a back-surface bridge type contact electrode of a crystalline silicon solar battery, which is prepared through silk screen printing, wherein a screen plate required for the silk screen printing is designed first, and after the deposition of an $Al_2O_3/SiN_x$: H passivation film on the back surface and the local opening of the film with a laser are complete, silk screen printing and a well designed back surface screen plate are used and an aluminium slurry is printed on the back surface, so as to make it form a pattern formed by a line-shaped array. The spacing between the lines is 1200 µm, and a part of the line-shaped array on the back surface is as shown in FIG. 6. The line width is 60 µm, the line length is 153 mm, the distance between the line edge and the back surface electrode 1 which is covered on the back surface $Al_2O_3/SiN_x$: H passivation film is 30 µm, and the bridge electrodes 4 having a width of 40 µm, a length of 30 µm and a spacing of 1 mm are further formed in the same printing. After conventional sintering, the local electrode 3 in the line together with the silicon wafer substrate 6 therebelow forms a local back surface field 5, and is connected to the back surface electrode 1 via the array of bridge electrodes 4. By using the method provided by the present invention, the void rate is reduced to 17% from 100%.

Embodiment IV

Figure 1:
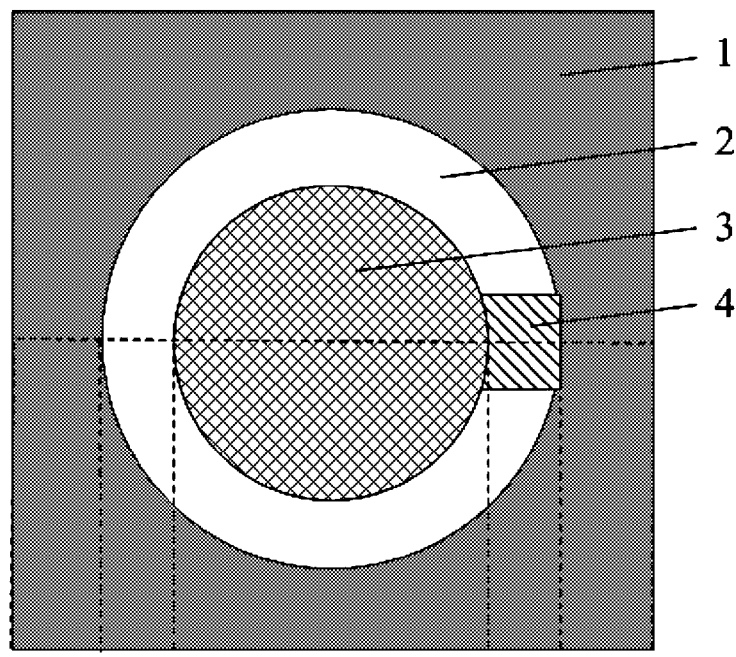
FIG. 1 is a structure schematic view of a first structure of a back-surface bridge type contact electrode of a crystalline silicon solar battery of the present invention.
Figure 2:
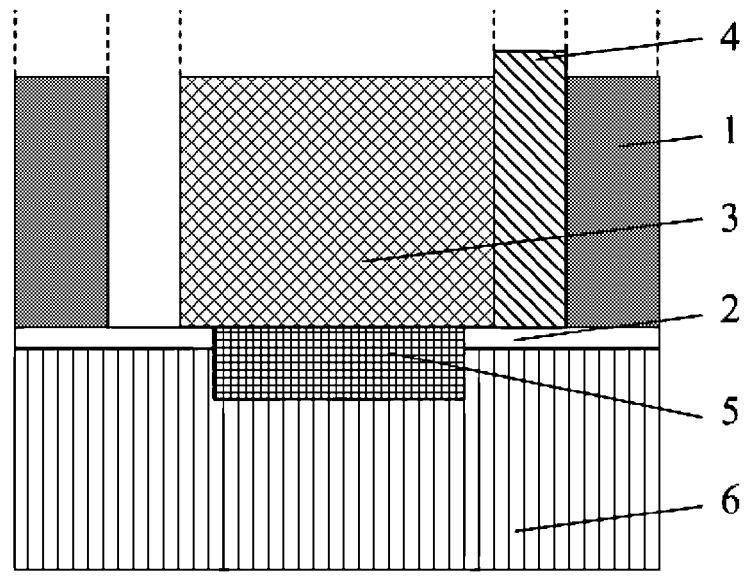
FIG. 2 is a structure section view of the back-surface bridge type contact electrode of a crystalline silicon solar battery of the present invention.

As shown in FIGS. 1 and 2, a back-surface bridge type contact electrode of a crystalline silicon solar battery is provided, which comprises a local electrode 3 connected to a local back surface field 5 and a back surface electrode 1 which is covered with a back surface passivation film 2 on a contact surface with a silicon wafer substrate 6, at least one bridge electrode 4 is provided between the local electrode 3 and the back surface electrode 1, the contact surface of the bridge electrode 4 and the silicon wafer substrate 6 is also covered with the back surface passivation film 2, the local electrode 3 is connected to the back surface electrode 1 via the bridge electrode 4, and the back surface passivation film 2 is also provided, besides at the connection region of the bridge electrode 4, between the local electrode 3 and the back surface electrode 1. The width of the bridge electrode 4 may be 0.1-50,000 µm, and the length may be 0.1-1,000 µm.

The material of the back surface passivation film 2 may be selected from one or more of aluminium oxide, silicon oxide, silicon nitride and titanium oxide.

The materials of the local electrode 3, the back surface electrode 1 and the bridge electrode 4 contain aluminium.

The cross section of the local electrode 3 can be in a line or dot shape, and the dot shape includes a circle, parallelogram or regular polygon.

When the cross section of the local electrode 3 is in a line shape, the width of the local electrode 3 is not less than 1 µm, and the spacing between the centres of the local electrodes 3 is not less than 100 µm.

When the cross section of the local electrode 3 is in a dot shape, the size of the local electrode 3 is not less than 1 µm, and the spacing between the centres of the local electrodes 3 is not less than 50 µm.

A method for preparing the back-surface bridge type contact electrode of a crystalline silicon solar battery is provided, which comprises the following steps:

1) providing a silicon wafer substrate 6 on which a back surface passivation film 2 is deposited, and locally opening the film with a laser;

2) depositing a unit formed by the arrangement of a back surface electrode 1 and a plurality of local electrodes 3 and bridge electrodes 4 in the back-surface bridge type contact electrode of a crystalline silicon solar battery on the back surface passivation film 2 of the silicon wafer substrate 6 by a CVD or PVD method; and 3) the local electrodes 3 and the silicon wafer substrate 6 forming a local back surface field 5 in a process of high temperature sintering.

The above-mentioned particular embodiments further illustrate the solved technical problems, the technical solutions and the beneficial effects of the present invention in detail; and it is to be understood that the above description is merely particular embodiments of the present invention and is not used to limit the present invention, and any modifications, equivalent alternatives, improvements, etc. that are made within the spirit and principle of the present invention should be included within the scope of protection of the present invention.

The invention claimed is:

1. A back-surface bridge type contact electrode of a crystalline silicon solar battery, which comprises a local electrode (3) connected to a local back surface field (5) and a back surface electrode (1) a silicon wafer substrate (6), a back surface passivation film (2) is provided between the back surface electrode (1) and the silicon wafer substrate (6), characterized in that at least one bridge electrode (4) is provided between the local electrode (3) and the back surface electrode (1), the back surface passivation film (2) is also provided between, the bridge electrode (4) and the silicon wafer substrate (6), the local electrode (3) is completely separated from the back surface electrode (1) and is only connected to the back surface electrode (1) via the bridge electrode (4), and there's at least one gap, in addition to the at least one bridge electrode (4), between the local electrode (3) and the back surface electrode (1), and the back surface passivation film (2) is also provided on the area of the silicon wafer substrate (6) where the at least one gap exists.

2. The back-surface bridge type contact electrode of a crystalline silicon solar battery according to claim 1, characterized in that the width of said bridge electrode (4) is 0.1-50,000 μm, and the length is 0.1-1,000 μm.

3. The back-surface bridge type contact electrode of a crystalline silicon solar battery according to claim 1, characterized in that the material of said back surface passivation film (2) is selected from one or more of aluminum oxide, silicon oxide, silicon nitride and titanium oxide.

4. The back-surface bridge type contact electrode of a crystalline silicon solar battery according to claim 1, characterized in that the materials of said local electrode (3), back surface electrode (1) and bridge electrode (4) contain aluminum.

5. The back-surface bridge type contact electrode of a crystalline silicon solar battery according to claim 1, characterized in that the cross section of said local electrode (3) is in a line or dot shape, and the dot shape includes a circle, parallelogram or regular polygon.

6. The back-surface bridge type contact electrode of a crystalline silicon solar battery according to claim 5, characterized in that when the cross section of said local electrode (3) is in a line shape, the width of the local electrode (3) is not less than 1 μm, and the spacing between the centers of adjacent local electrodes (3) is not less than 100 μm.

7. The back-surface bridge type contact electrode of a crystalline silicon solar battery according to claim 5, characterized in that when the cross section of said local electrode (3) is in a dot shape, the size of the local electrode (3) is not less than 1 μm, and the spacing between the centres of the local electrodes (3) is not less than 50 μm.

8. A method for preparing the back-surface bridge type contact electrode of a crystalline silicon solar battery of claim 1, which comprises the following steps:
   1) providing a screen plate for silk screen printing, wherein the screen plate provides a gauze in the back surface electrode (1) region and an array region composed of a plurality of the local electrodes (3) and bridge electrodes (4) in the back-surface bridge type contact electrode of a crystalline silicon solar battery of claim 1, through which a slurry can pass, and the other part is composed of a membrane which is impermeable to the slurry;
   2) providing the silicon wafer substrate (6) on which the back surface passivation film (2) is deposited, and locally opening the film with a laser;
   3) printing a metal slurry on the back surface of the silicon wafer substrate (6) using the screen plate in step 1) by a silk screen printing method; and
   4) the local electrodes (3) and the silicon wafer substrate (6) forming a local back surface field (5) in a process of high temperature sintering.

9. A method for preparing the back-surface bridge type contact electrode of a crystalline silicon solar battery of claim 1, which comprises the following steps:
   1) providing the silicon wafer substrate (6) on which the back surface passivation film (2) is deposited, and locally opening the film with a laser;
   2) depositing a unit formed by the arrangement of a back surface electrode (1) and a plurality of the local electrodes (3) and bridge electrodes (4) in the back-surface bridge type contact electrode of a crystalline silicon solar battery of claim 1 on the back surface passivation film (2) of the silicon wafer substrate (6) by a CVD or PVD method; and
   3) the local electrodes (3) and the silicon wafer substrate (6) forming a local back surface field (5) in a process of high temperature sintering.

10. The back-surface bridge type contact electrode of a crystalline silicon solar battery according to claim 1, wherein the local electrode (3) is adapted to draw out electric energy generated in the silicon wafer substrate (6).

11. The back-surface bridge type contact electrode of a crystalline silicon solar battery according to claim 10, wherein the back surface electrode (1) is adapted to collect the electric energy drawn out by the local electrodes (3) such that the electric energy is output from the battery.

* * * * *